(12) United States Patent
Ootorii

(10) Patent No.: US 9,577,404 B2
(45) Date of Patent: *Feb. 21, 2017

(54) SEMICONDUCTOR LASER DEVICE, PHOTOELECTRIC CONVERTER, AND OPTICAL INFORMATION PROCESSING UNIT

(71) Applicant: Sony Corporation, Tokyo (JP)

(72) Inventor: Hiizu Ootorii, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/993,737

(22) Filed: Jan. 12, 2016

(65) Prior Publication Data

US 2016/0126694 A1 May 5, 2016

Related U.S. Application Data

(63) Continuation of application No. 14/219,393, filed on Mar. 19, 2014, now Pat. No. 9,270,081, which is a (Continued)

(30) Foreign Application Priority Data

Oct. 12, 2011 (JP) ................................. 2011-224950

(51) Int. Cl.
*H01S 5/02* (2006.01)
*H01L 31/167* (2006.01)
(Continued)

(52) U.S. Cl.
CPC ............... *H01S 5/02* (2013.01); *H01L 31/167* (2013.01); *H01S 5/0224* (2013.01);
(Continued)

(58) Field of Classification Search
CPC .......... H01S 5/02; H01S 5/02288; H01S 5/18; H01S 5/183; H01S 5/18311; H01S 5/18313; H01S 5/18319; H01S 5/18325; H01S 5/18327; H01S 5/18344; H01S 5/18347

See application file for complete search history.

(56) References Cited

U.S. PATENT DOCUMENTS 8,724,670 B2 * 5/2014 Ootorii ................. H01L 31/167
372/46.01
9,270,081 B2 * 2/2016 Ootorii ................. H01L 31/167
(Continued)

FOREIGN PATENT DOCUMENTS

JP 2005-181610 7/2005
JP 2006-258835 9/2006
(Continued)

OTHER PUBLICATIONS

Japanese Office Examination Report issued in connection with related Japanese Patent Application No. 2011-224950 dated Jun. 2, 2015.

*Primary Examiner* — Xinning Niu
(74) *Attorney, Agent, or Firm* — Dentons US LLP

(57) ABSTRACT

A semiconductor laser device that enables flip-chip assembly by having an embedding section around a mesa section, and that has an improved emission lifetime, as well as a photoelectric converter and an optical information processing unit each having such a semiconductor laser device. The semiconductor laser device includes: a mesa section including an active layer, and having a first electrode on a top surface; an embedding section covering the mesa section, and having a first connection aperture that reaches the first electrode; and a first wiring provided on the embedding section overlaying the first connection aperture, the first wiring being electrically connected to the first electrode through the first connection aperture.

10 Claims, 11 Drawing Sheets

Related U.S. Application Data continuation of application No. 13/616,261, filed on Sep. 14, 2012, now Pat. No. 8,724,670.

(51) Int. Cl.
    *H01S 5/022*     (2006.01)
    *H01S 5/183*     (2006.01)
    *H01S 5/024*     (2006.01)

(52) U.S. Cl.
    CPC ...... *H01S 5/02288* (2013.01); *H01S 5/18305* (2013.01); *H01S 5/02276* (2013.01); *H01S 5/02469* (2013.01); *H01S 2301/176* (2013.01)

(56) References Cited

U.S. PATENT DOCUMENTS

| | | |
|---|---|---|
| 2006/0056473 A1 | 3/2006 | Tanigawa et al. |
| 2007/0153861 A1 | 7/2007 | Collins et al. |
| 2008/0031295 A1 | 2/2008 | Tanaka |

FOREIGN PATENT DOCUMENTS

| | | |
|---|---|---|
| JP | 2007-237428 | 9/2007 |
| JP | 2008-071900 | 3/2008 |
| JP | 2010-141087 | 6/2010 |

\* cited by examiner

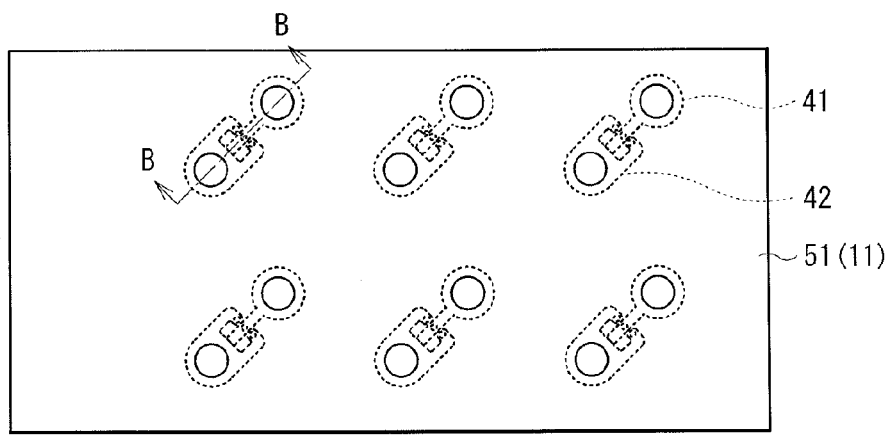
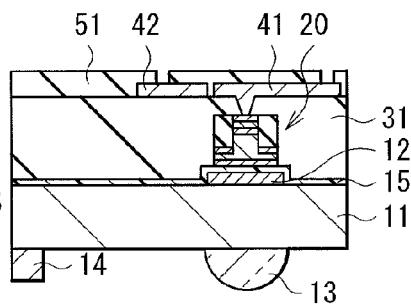
FIG. 9A
FIG. 9B

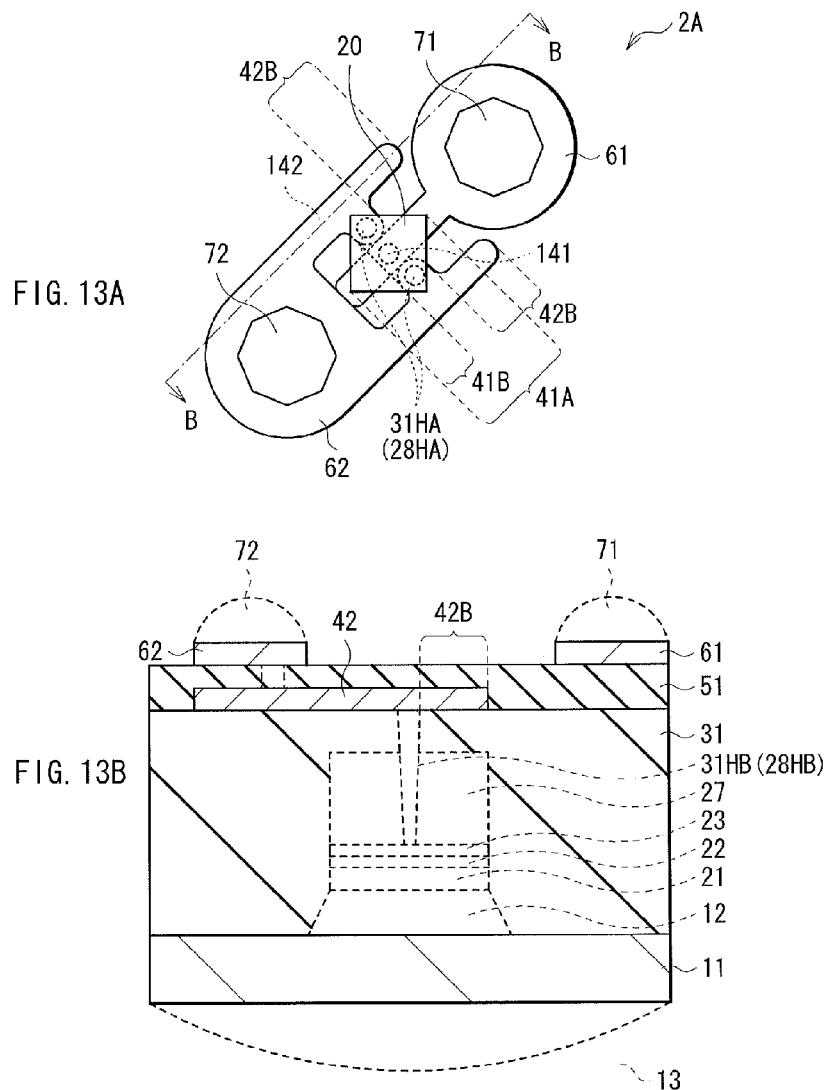

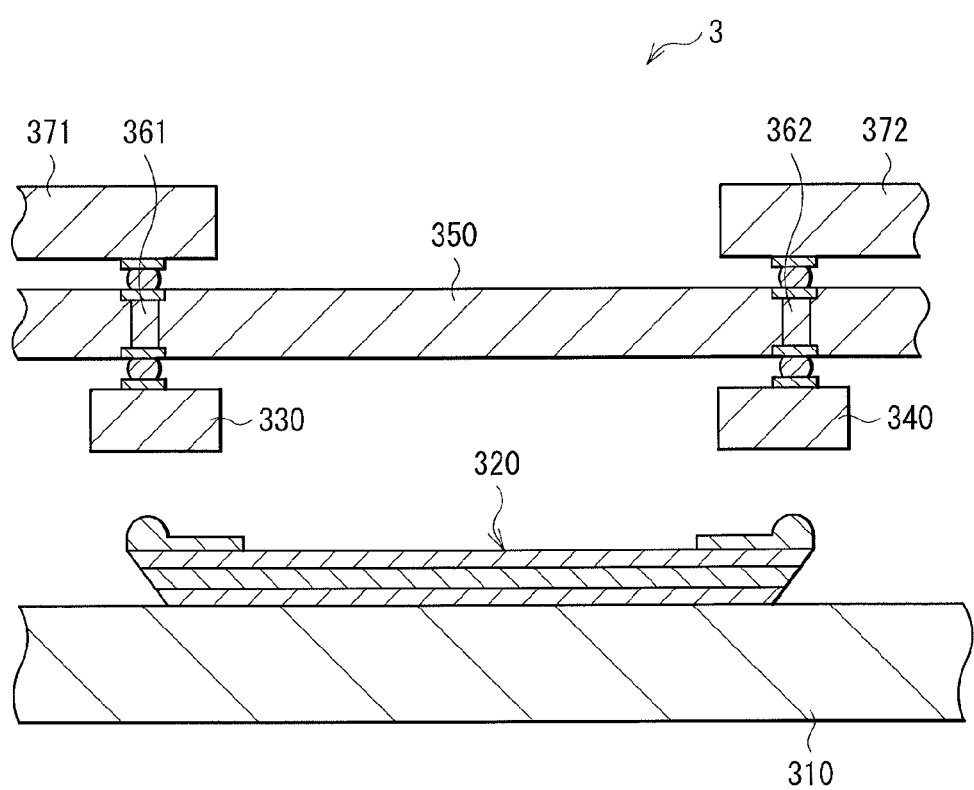
F I G. 14

SEMICONDUCTOR LASER DEVICE, PHOTOELECTRIC CONVERTER, AND OPTICAL INFORMATION PROCESSING UNIT

RELATED APPLICATION DATA

This application is a continuation of U.S. patent application Ser. No. 14/219,393 filed Mar. 19, 2014, which is a continuation of U.S. patent application Ser. No. 13/616,261 filed Sep. 14, 2012, now U.S. Pat. No. 8,724,670 issued May 13, 2014, the entireties of which are incorporated herein by reference to the extent permitted by law. The present application claims the benefit of priority to Japanese Patent Application No. JP 2011-224950 filed on Oct. 12, 2011 in the Japan Patent Office, the entirety of which is incorporated by reference herein to the extent permitted by law.

BACKGROUND

The technology relates to a semiconductor laser device having a mesa section, and also to a photoelectric converter and an optical information processing unit each having the semiconductor laser device.

In recent years, as microprocessor units (MPUs) have become more sophisticated in functionality, the amount of data transmitted and received among semiconductor chips such as large scale integration (LSI) has greatly increased. Thus, speed enhancement and capacity enlargement of signal transmission have been strongly desired. As a way of realizing these, optical transmission coupling technology (optical interconnection) in which electric signals are converted into optical signals and transmitted has been attracting attention (for example, see "Encounter with Optical Interconnection", Nikkei Electronics, Dec. 3, 2001, pages 122 to 125, FIGS. 4 to 7, and also, see "Trends in Optical Interconnection Technology and their Impact on Next-Generation Equipment Packaging", Yasuhiro Ando, NTT R&D, Vol. 48, No. 3, pages 271 to 280 (1999)).

In the optical transmission coupling technology (optical interconnection), a light-emission device (e.g., a surface-emitting semiconductor laser device) and a photodetector (e.g., a photodiode) are provided on a printed circuit board, and optical signals are transmitted through an optical waveguide (see Japanese Unexamined Patent Application Publication Nos. 2005-181610, 2006-237428, and 2006-258835, for example).

This surface-emitting semiconductor laser (vertical cavity surface emitting laser (VCSEL)) device serving as the light-emission device has, for example, an n-side electrode, a lower distributed bragg reflector (DBR) layer, an active layer, an upper DBR layer, and a p-side electrode in this order from a substrate side. Further, a mesa section is provided in a part of the surface-emitting semiconductor laser. This mesa section is embedded in an insulating layer made of resin. In other words, a top surface of such a laminated body is flat, which enables flip-chip assembly (see, for example, Japanese Unexamined Patent Application Publication No. 2010-141087).

SUMMARY

The semiconductor laser device described above has a disadvantage that the emission lifetime is shorter than that of a laser device that is not provided with the insulating layer.

It is desirable to provide a semiconductor laser device that enables flip-chip assembly by providing an embedding section around a mesa section, and has an improved emission lifetime. It is also desirable to provide a photoelectric converter and an optical information processing unit each having the semiconductor laser device.

According to an embodiment of the technology, there is provided a semiconductor laser device that includes: a mesa section including an active layer, and having a first electrode on a top surface; an embedding section covering the mesa section, and having a first connection aperture that reaches the first electrode; and a first wiring provided on the embedding section to be laid across the first connection aperture, the first wiring being electrically connected to the first electrode through the first connection aperture. Specifically, the first wiring extends on both sides of the first connection aperture, and has a length equal to or longer than a radius of the columnar mesa section.

In a semiconductor laser device, thermal expansion of an embedding section occurs due to heat produced upon activation or a change in the ambient temperature. In the above-described embodiment, however, since the first wiring is provided to be laid across both sides of the first connection aperture, stress exerted on the mesa section due to a difference in coefficient of thermal expansion between the embedding section and the first wiring is substantially offset on both sides of the first connection aperture.

According to an embodiment of the technology, there is provided a photoelectric converter including a semiconductor laser device. The semiconductor laser device includes: a mesa section including an active layer, and having a first electrode on a top surface; an embedding section covering the mesa section, and having a first connection aperture that reaches the first electrode; and a first wiring provided on the embedding section to be laid across the first connection aperture, the first wiring being electrically connected to the first electrode through the first connection aperture.

According to an embodiment of the technology, there is provided an optical information processing unit including a semiconductor laser device and a photodetector of receiving light emitted from the semiconductor laser device. The semiconductor laser device includes: a mesa section including an active layer, and having a first electrode on a top surface; an embedding section covering the mesa section, and having a first connection aperture that reaches the first electrode; and a first wiring provided on the embedding section to be laid across the first connection aperture, the first wiring being electrically connected to the first electrode through the first connection aperture.

According to the semiconductor laser device, the photoelectric converter, and the optical information processing unit in the above-described embodiments of the technology, the first wiring is provided to be laid across the first connection aperture. Thus, exertion of stress in a biased direction on the mesa section is allowed to be suppressed. Therefore, deterioration of the active layer due to thermal expansion of the embedding section is prevented, which allows an improvement in emission lifetime.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 9A and 9B are diagrams illustrating a process following the process of FIG. 8.

FIGS. 13A and 13B are diagrams each illustrating a configuration of a semiconductor laser device according to a modification.

FIG. 14 is a cross-sectional diagram illustrating a configuration of an optical information processing unit according to an application example of the photoelectric converter depicted in FIGS. 1A and 1B.

DETAILED DESCRIPTION

An embodiment of the technology will be described below in detail with reference to the drawings. It is to be noted that the description will be provided in the following order.

1. Embodiment

Figure 1A:
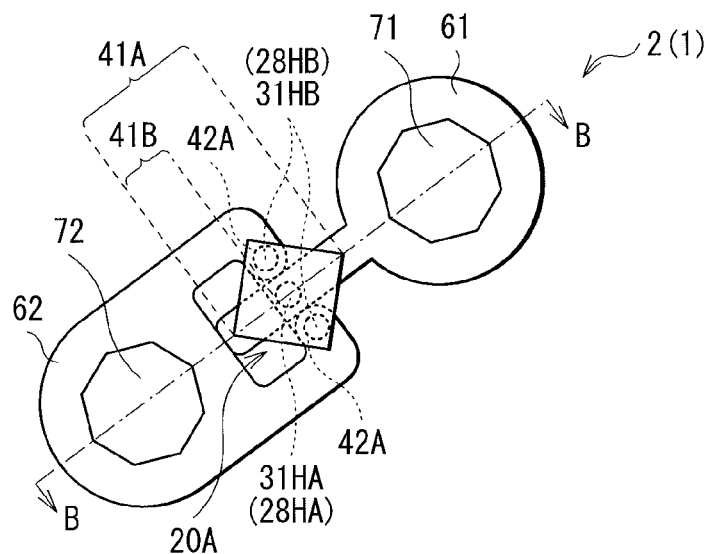
FIGS. 1A and 1B are diagrams each illustrating a configuration of a semiconductor laser device in a photoelectric converter according to an embodiment of the disclosure.
Figure 1B:
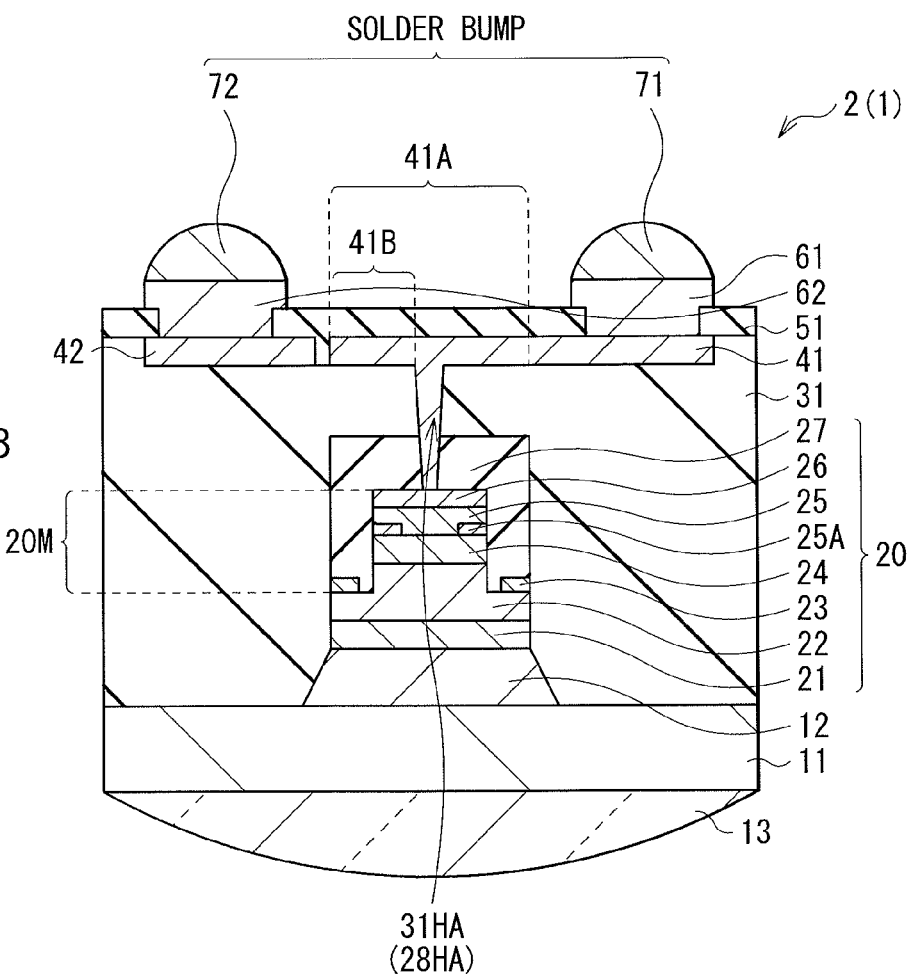

An example in which a first wiring is provided to be laid across a first connection aperture 2. Modification An example in which, besides the first wiring, a second wiring is also provided to be laid across a second connection aperture 3. Application Example An example of an optical information processing unit Embodiment FIGS. 1A and 1B illustrate a structure of a surface-emitting semiconductor laser device (a semiconductor laser device 2) of a photoelectric converter (a photoelectric converter 1) according to an embodiment of the disclosure. A plurality of semiconductor laser devices 2 is disposed in the photoelectric converter 1. The photoelectric converter 1 is a light emitting unit that converts an inputted electric signal into an optical signal and transmits the optical signal. The photoelectric converter 1 combined with a photoreceiver (a photodetector) serves as an optical information processing unit (e.g., an optical information processing unit 3 in FIG. 14, which will be described later). FIG. 1A illustrates a configuration of a top surface of the semiconductor laser device 2, and FIG. 1B illustrates a cross-sectional configuration taken along a line B-B in FIG. 1A. The photoelectric converter 1 may be configured using the one (single) semiconductor laser device 2.

The semiconductor laser device 2 includes a laminated body 20, an insulating layer 31, wirings (a p-side wiring 41 and an n-side wiring 42), a passivation layer 51, under bump metal (UBM) layers 61 and 62, and solder bumps 71 and 72 in this order on a substrate 11. The laminated body 20 includes an active layer 24. The solder bumps 71 and 72 are provided for flip-chip assembly on, for example, an interposer, to establish electrical connection thereto. The semiconductor laser device 2 receives a signal from a control semiconductor chip mounted on the interposer, and outputs a laser beam from the substrate 11 side.

The substrate 11 is a light transmissive substrate (a transparent substrate), and configured using, for example, a glass substrate, a resin substrate, or a sapphire substrate. The substrate 11 made of the sapphire substrate is superior in terms of heat dissipation. Provided on a surface of this substrate 11 is a base 12, and the laminated body 20 is disposed on this base 12. The base 12 and the laminated body 20 have the respective surfaces facing each other, and these surfaces have the same shape, for example, a square. As will be described later, this base 12 makes it possible to easily transfer a desired number of the laminated bodies 20 from a device formation substrate (a device formation substrate 29A in FIG. 2B) to the substrate 11. The laminated bodies 20 are densely formed on the device formation substrate. The substrate 11 has a thickness (a thickness in a lamination direction, which will be hereinafter simply referred to as "thickness") of, for example, about 500 µm. The base 12 has a height of, for example, about 1 µm to 10 µm. On an undersurface (a back side) of the substrate 11, a lens 13 (a collimate lens) is provided at a position facing the active layer 24 (the laminated body 20). The lens 13 outputs parallel light after changing light coming from the active layer 24 to the parallel light. The lens 13 has a diameter of, for example, about 240 µm. The center of the base 12 is at the same position as the center of the lens 13 in a planar view.

The laminated body 20 includes an N—GaAs layer 21, a lower DBR layer 22 (a first multilayer reflective film), the active layer 24, an upper DBR layer 25 (a second multilayer reflective film), and a p-side electrode 26 (a first electrode) in this order from the substrate 11 side. A columnar mesa section 20M is provided above a part of the lower DBR layer 22 of the laminated body 20 (in an upper part of the lower DBR layer 22, the active layer 24, the upper DBR layer 25, and the p-side electrode 26). The p-side electrode 26 is provided on a top surface of the mesa section 20M, and an n-side electrode 23 (a second electrode) paired with the p-side electrode 26 is provided around the mesa section 20M. The n-side electrode 23 may be provided one, or more than one. The p-side electrode 26 and the n-side electrode 23 are in contact with an upper part of the upper DBR layer 25 and a lower part of the lower DBR layer 22, respectively. The laminated body 20 is configured by covering the mesa section 20M and the n-side electrode 23 with an insulating layer 27 (a first insulating layer). In other words, the mesa section 20M is protected by being embedded in the insulating layer 27, and the laminated body 20 is shaped like a pillar (a square pole) with a flat top surface, which enables flip-chip assembly. In a planar view, the mesa section 20M is, for example, a circle having a diameter of about 42 µm, and the laminated body 20 is, for instance, a square measuring about 46 µm per side. The center of the circle of the mesa section 20M and the center of the square of the laminated body 20 are substantially at the same position.

The insulating layer 27 is configured using resin, and is made of, for example, a polyimide. The insulating layer 27 has a connection aperture 28HA and a connection aperture 28HB reaching the p-side electrode 26 and the n-side electrode 23, respectively. The connection aperture 28HA is provided to electrically connect the p-side electrode 26 to the p-side wiring 41, and the connection aperture 28HB is provided to electrically connect the n-side electrode 23 to the n-side wiring 42. The connection aperture 28HA is provided at one location in the center of the mesa section 20M (the laminated body 20), and the connection aperture 28HB is provided at each of two locations, namely, near each of two corners of the laminated body 20. The two connection apertures 28HB are provided along a diagonal line on the top surface of the laminated body 20. It is preferable that the connection apertures 28HB be symmetric with respect to a central point of the mesa section 20M. This is because, of the n-side wiring 42, regions (counter regions 42A described later) facing each other immediately above the laminated body 20 can be provided to have point symmetry.

The n-side electrode (a cathode electrode) 23 is provided to apply a voltage to the lower DBR layer 22, the active layer 24, and the upper DBR layer 25, with the p-side electrode (an anode electrode) 27. The n-side electrode 23 is configured by laminating, for example, germanium (Ge), gold (Au), nickel (Ni), and gold in this order. The N—GaAs layer 21 is an n-type GaAs layer. The lower DBR layer 22 is a layer in which a high refractive index layer and a low refractive index layer are laminated alternately. The lower DBR layer 22 is, for example, an n-type AlGaAs layer. The active layer 24 has a quantum well structure, and includes, for example, a GaAs layer and an AlGaAs layer as a well layer and a barrier layer. The upper DBR layer 25 is a layer in which a low refractive index layer and a high refractive index layer are laminated, like the lower DBR layer 22. The upper DBR layer 25 is, for example, a p-type AlGaAs layer. Of the upper DBR layer 25, a part in proximity to the active layer 24 is provided with an oxidation confinement section 25A that has a current confinement function. The oxidation confinement section 25A is shaped like a ring, and provided on an outer edge of the upper DBR layer 25, and thereby a current injection region is formed in a central part. The oxidation confinement section 25A is configured to include, for example, aluminum oxide ($Al_2O_3$). The p-side electrode 26 has, for example, a laminated structure of titanium (Ti), platinum (Pt), nickel, and gold. The laminated body 20 as a whole has a thickness of, for example, about 6 µm.

The insulating layer 31 (a second insulating layer) covers the laminated body 20 by being provided on the top surface of the laminated body 20 and a space between the laminated bodies 20 adjacent to each other. The insulating layer 31 is made of resin, e.g. a polyimide, and has a thickness of about 10 to 15 µm. The insulating layer 31 has connection apertures 31HA and 31HB provided at the same positions as those of the connection apertures 28HA and 28HB, respectively, in a planar view. The connection apertures 31HA and 31HB each have, for example, a diameter of about 10 µm.

The embedding section of the technology is configured using the insulating layer 31 and the above-described insulating layer 27. The first connection aperture of the technology is equivalent to each of the connection apertures 31HA and 28HA, and the second connection aperture according to an embodiment of the technology is equivalent to each of the connection apertures 31HB and 28HB.

The p-side wiring 41 and the n-side wiring 42 are provided on the insulating layer 31. The p-side wiring 41 electrically connects the p-side electrode 26 to the solder bump 71 (the UBM layer 61), and the n-side wiring 42 electrically connects the n-side electrode 23 to the solder bump 72 (the UBM layer 62). The p-side wiring 41 has a counter region 41A directly above the laminated body 20. In the p-side wiring 41 of the present embodiment, an excess wiring section 41B is provided in this counter region 41A. The excess wiring section 41B is a part of the counter region 41, the part extending from the connection aperture 31HA in a direction opposite to the bump 71 (180 degrees opposite). In other words, the p-side wiring 41 is provided to extend from the solder bump 71 beyond the connection aperture 31HA and to be laid across both sides (the solder bump 71 side and the other side) of the connection aperture 31HA. One end (the other side of the solder bump 71) of the excess wiring section 41B is not connected to other terminal, and a signal is inputted into the p-side wiring 41 from only the solder bump 71 side. As will be described later in detail, this excess wiring section 41B makes it possible to suppress deterioration of the mesa section 20M embedded in the insulating layer 31. In order to further improve an effect of suppressing the deterioration of the mesa section 20M, it is preferable that the excess wiring region 41B have a length equal to or longer than the radius of the mesa section 20M. More preferably, the counter region 41A is shaped to have substantially point symmetry with respect to a point at the center of the mesa section 20M. In other words, the p-side wiring 41 extends to have a length equal to or longer than the radius of the mesa section 20M, on each of both sides of the connection aperture 31HA. Like the p-side wiring 41, the n-side wiring 42 also has a counter region 42A directly above the laminated body 20. The n-side wiring 42 has the two counter regions 42A, because the insulating layer 31 (the insulating layer 27) is provided with the two connection apertures 31HB (28HB). In the n-side wiring 42, the two counter regions 42A are provided to have substantially point symmetry with respect to a point at the center of the mesa section 20M. Although the n-side wiring 42 is provided only on one side of the connection aperture 31HB, the effect of suppressing the deterioration of the mesa section 20M is further improved by thus providing the counter region 42A. It is to be noted that the "substantially point symmetry" mentioned above may be at any level as long as the effect of suppressing the deterioration of the mesa section 20M is achieved. In other words, errors and the like in manufacturing are included therein. The p-side wiring 41 and the n-side wiring 42 are disposed to be level with each other, and each have, for example, a layered structure including a titanium (Ti) layer having a thickness of about 50 nm and a copper (Cu) layer having a thickness of about 1,000 nm.

The passivation layer 51 has a thickness of, for example, about 2 µm, and is made of polyimide. The passivation layer 51 has an opening of, for example, about 60 µm in diameter at a starting point of each of the p-side wiring 41 and the n-side wiring 42. At this opening of the passivation layer 51, each of the UBM layers 61 and 62 of about 80 µm in diameter, for example, is provided. The UBM layers 61 and 62 are each configured using, for example, a gold (Au) layer having a thickness of about 50 nm and a nickel (Ni) layer having a thickness of about 5 μm. The solder bumps 71 and 72 are each made of, for example, an alloy of tin (Sn), silver (Ag), and copper (Cu), and provided on the UBM layers 61 and 62, respectively. The UBM layers 61 and 62 as well as the solder bumps 71 and 72 are provided, for example, on a diagonal line of the laminated body 20.

Figure 7A:
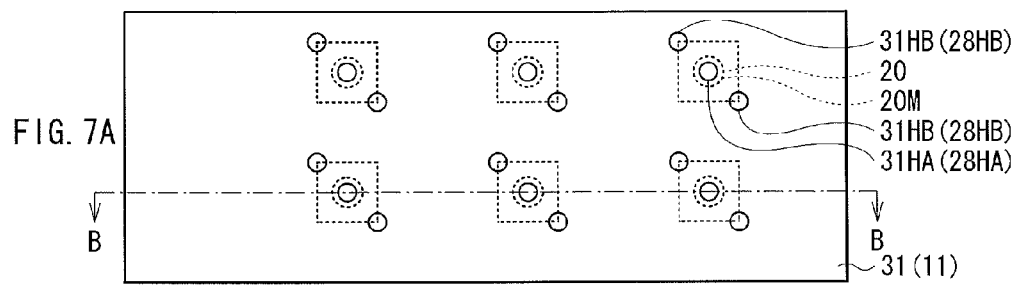
FIGS. 7A and 7B are diagrams illustrating a process following the process of FIGS. 6A and 6B.
Figure 7B:
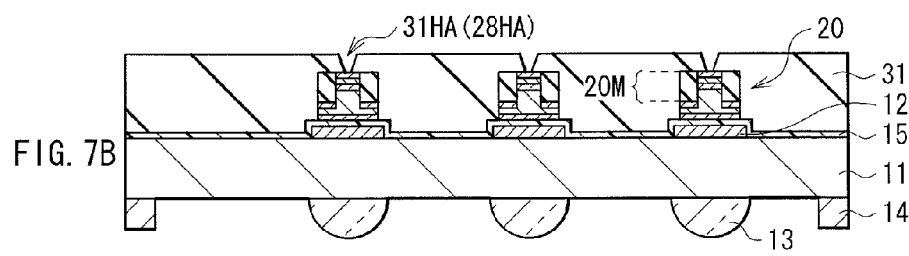
Figure 8:
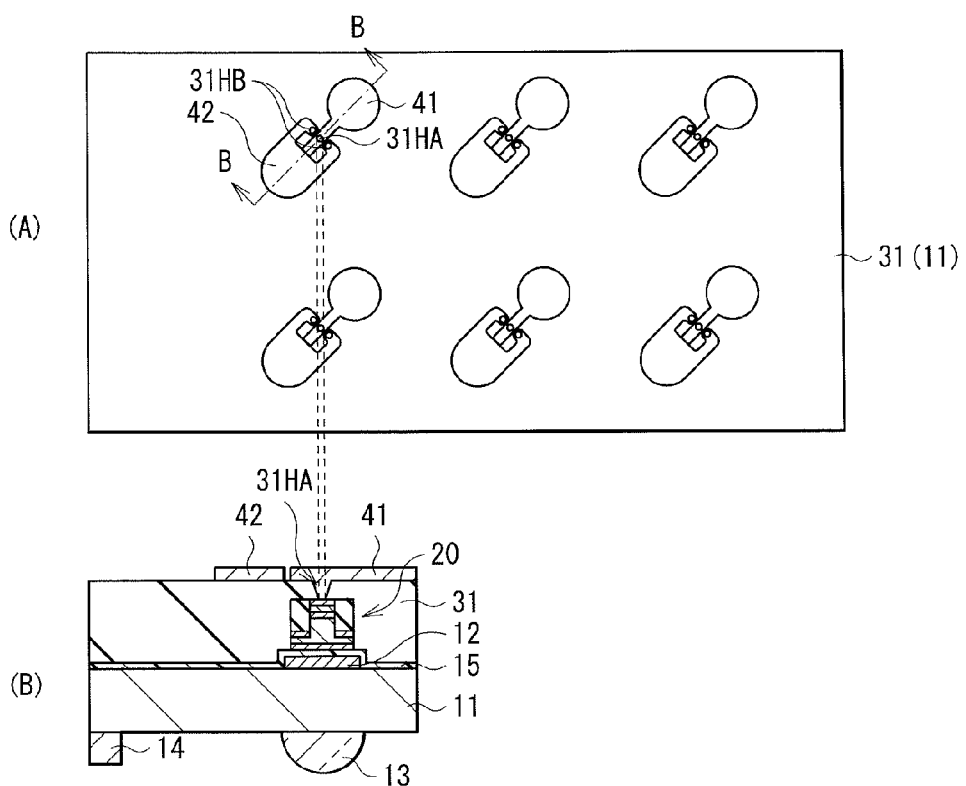
FIG. 8 is a diagram illustrating a process following the process of FIGS. 7A and 7B.

A method of manufacturing the photoelectric converter 1 having the semiconductor laser devices 2 will be described using FIG. 2A to FIG. 11B. FIGS. 2A, 3A, 4A, 5A, 6A, 7A, 9A, 10A, 11A, and Part (A) of FIG. 8 each illustrate a plan view of each process. FIG. 2B illustrates a cross-sectional diagram taken along a line B-B illustrated in FIG. 2A, and FIGS. 3B, 4B, 5B, 6B, 7B, 8B, 10B, FIG. 11B, and Part (B) of FIG. 8 illustrate likewise.

First, for example, each of the laminated bodies 20 is formed on the device formation substrate 29A. The laminated body 20 is formed, for example, as follows. On the device formation substrate 29A made of gallium arsenide (GaAs), crystal growth of each of an n-type GaAs layer, an n-type AlGaAs layer, an i-GaAs layer, and a p-type AlGaAs layer is caused in this order, for instance. Subsequently, the devices are separated by photolithography and etching and also, the mesa section 20M is formed. At this moment, an AlAs layer is formed in a part of the p-type AlGaAs layer, the part being on the GaAs layer side. The oxidation confinement section 25A is formed by oxidizing this AlAs layer. Next, after the p-side electrode 26 and the n-side electrode 23 are provided, the insulating layer 27 is formed. A reduction in cost is allowed by forming the semiconductor laser devices 2 on the device formation substrate 29A as densely as possible.

Figure 2A:
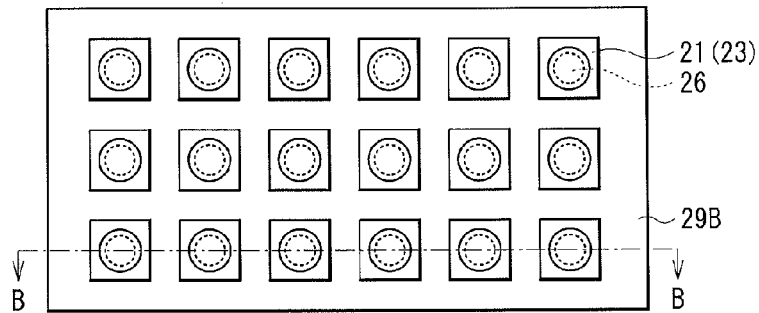
FIGS. 2A and 2B are diagrams illustrating a method of manufacturing the photoelectric converter depicted in FIGS. 1A and 1B, in a process order.
Figure 2B:
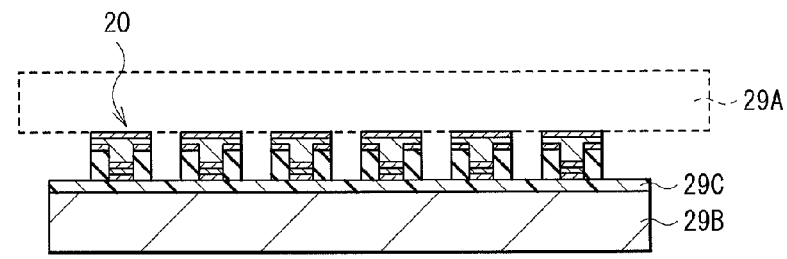

After the laminated bodies 20 are provided on the device formation substrate 29A, the insulating layer 27 (on the p-side electrode 26 side) is caused to be in contact with a supporting substrate 29B having a surface provided with an adhesive layer 29C, and thereby the laminated body 20 is fixed, as illustrated in FIGS. 2A and 2B. The device formation substrate 29A is then removed by etching. The supporting substrate 29B is, for example, a quartz substrate, and the adhesive layer 29C is made of, for example, silicone resin.

Figure 3A:
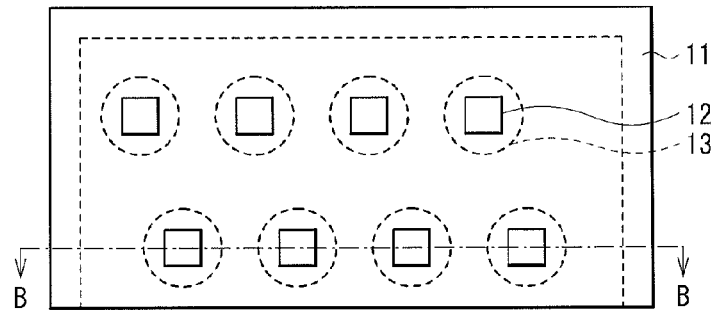
FIGS. 3A and 3B are diagrams illustrating a process following the process of FIGS. 2A and 2B.
Figure 3B:
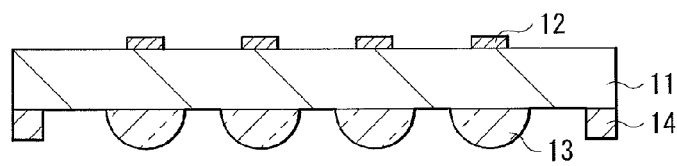

Meanwhile, the substrate 11 having the base 12 and the lens 13 is prepared (FIGS. 3A and 3B). It is preferable that a protection wall 14 used to protect the lens 13 be provided on the substrate 11. The base 12 can be formed by etching, when the substrate 11 is, for example, a transparent substrate made of a material such as glass. Alternatively, the base 12 can be formed by injection molding, when the substrate 11 is, for example, a resin substrate. Still alternatively, the base 12 may be formed by photolithography and etching, after a resin layer made of UV-curable resin such as acrylic resin, polyimide, or spin-on-glass (SOG) is formed on the substrate 11. At this moment, a space between the bases 12 next to each other is greater than that between the laminated bodies 20 next to each other on the supporting substrate 29B (the device formation substrate 29A). The lens 13 and the protection wall 14 can be formed highly precisely with enhanced yields, by application of a semiconductor manufacture process at a wafer level. Specifically, a technique such as a three-dimensional-shape molding technique based on three-dimensional exposure technology using a gray mask may be applied.

Figure 4A:
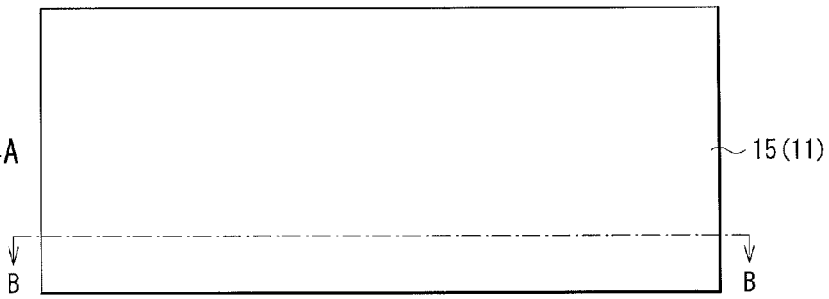
FIGS. 4A and 4B are diagrams illustrating a process following the process of FIGS. 3A and 3B.
Figure 4B:
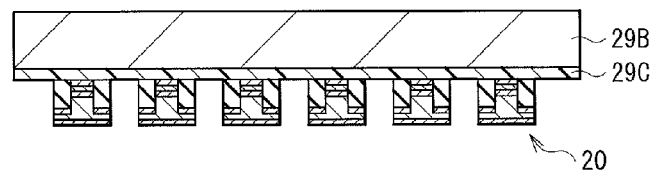

Next, an adhesive layer 15 is provided on a surface (a surface on the base 12 side) of the substrate 11, as illustrated in FIGS. 4A and 4B. Subsequently, the laminated bodies 20 held by the supporting substrate 29B are pressed against this adhesive layer 15. The adhesive layer 15 is formed on the entire surface of the substrate 11 including the base 12, by applying a UV-curable resin, for instance, through coating such as spin coating. The laminated bodies 20 are abutted thereon before this UV-curable resin hardens. At this moment, a bearing surface of the base 12 is slightly higher than a surface around the base 12, and among the laminated bodies 20 held by the supporting substrate 29B, only those in regions facing the bases 12 are in contact with the adhesive layer 15 of the substrate 11. This thins out the laminated bodies 20 on the supporting substrate 29B, allowing a desired number of the laminated bodies 20 to be transferred to the substrate 11. In other words, the laminated bodies 20 are allowed to be formed on the device formation substrate 29A efficiently (densely), which enables the semiconductor laser devices 2 to be formed at low cost.

Figure 5A:
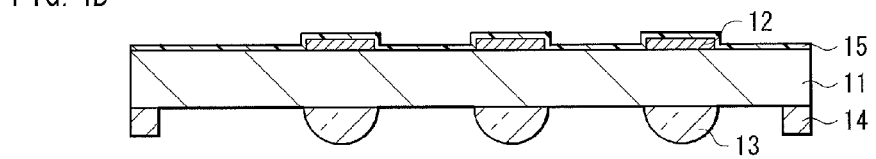
FIGS. 5A and 5B are diagrams illustrating a process following the process of FIGS. 4A and 4B.
Figure 5B:
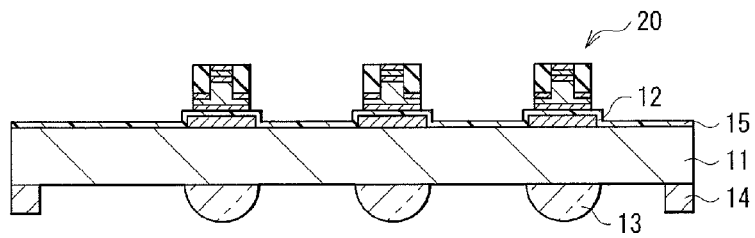

After the laminated bodies 20 are caused to be in contact with the adhesive layer 15, the adhesive layer 15 is cured and thereby the laminated bodies 20 on the base 12 are fixed. When the adhesive layer 15 is made of the UV-curable resin, ultraviolet rays are irradiated from the back side of the substrate 11, for example, I-rays are irradiated for about 60 seconds. Next, as illustrated in FIGS. 5A and 5B, when the supporting substrate 29B and the substrate 11 are gently separated from each other, only the laminated bodies 20 facing the bases 12 are adhered and fixed to the substrate 11. The laminated bodies 20, except those fixed to the substrate 11, remain held by the supporting substrate 29B, and are used in or after the next transfer.

Figure 6A:
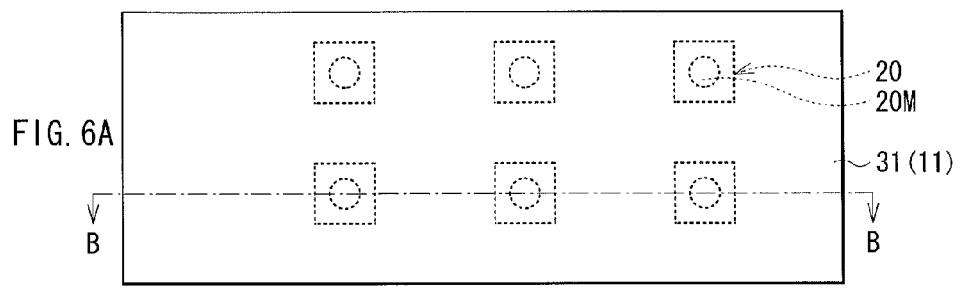
FIGS. 6A and 6B are diagrams illustrating a process following the process of FIGS. 5A and 5B.
Figure 6B:
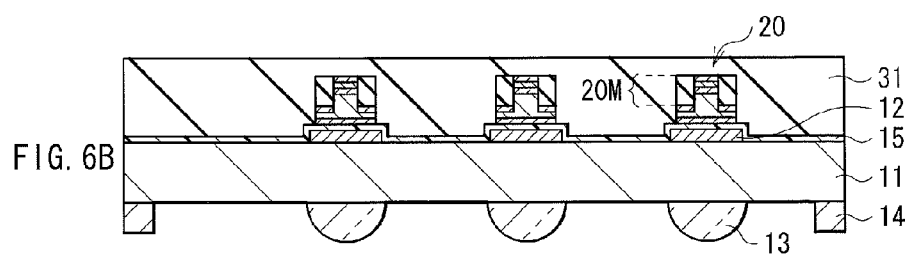

After the laminated bodies 20 are provided on the bases 12, the insulating layer 31 is formed as illustrated in FIGS. 6A and 6B. Subsequently, the connection apertures 31HA (28HA) and 31HB (28HB) are formed in the insulating layer 31 and the insulating layer 27, as illustrated in FIGS. 7A and 7B.

After the connection apertures 31HA (28HA) and 31HB (28HB) are formed, the p-side wiring 41 and the n-side wiring 42 are formed as illustrated in Part (A) and Part (B) of FIG. 8. The p-side wiring 41 and the n-side wiring 42 are formed, for example, by forming a film of a titanium layer having a thickness of about 50 nm and a copper layer having a thickness of about 1,000 nm in this order on the insulating layer 31 by sputtering, and then patterning this film. The p-side wiring 41 and the n-side wiring 42 are provided with substantially circular or oval portions used to establish connection to the solder bumps 71 and 72 (the UBM layers 61 and 62). These circular or oval portions are provided at parts away from a location directly above each of the laminated bodies 20. The p-side wiring 41 and the n-side wiring 42 have extensions from these portions to the connection apertures 31HA and 31HB. Further, the excess wiring section 41B is formed in the p-side wiring 41. This excess wiring section 41B is provided to suppress the deterioration of the mesa section 20M as described above. It is preferable that the excess wiring section 41B be formed so that the counter region 41A has point symmetry. However, the excess wiring section 41B may be of any length (size) as long as the length allows achievement of the effect. It is desirable that the n-side wiring 42 be formed so that, besides the counter regions 42A, the neighborhood of the n-side wiring 42 have point symmetry with respect to the laminated body 20 (the mesa section 20M).

Figure 10A:
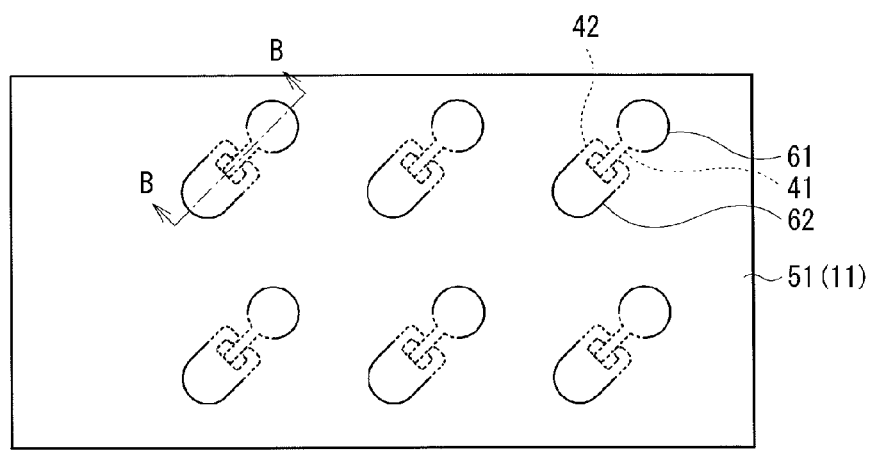
FIGS. 10A and 10B are diagrams illustrating a process following the process of FIGS. 9A and 9B.
Figure 10B:
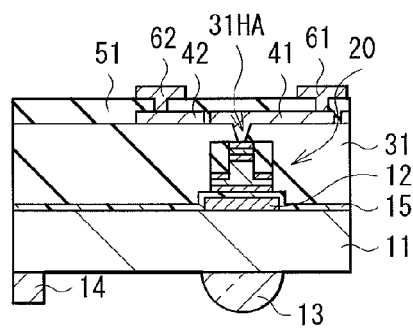
Figure 11A:
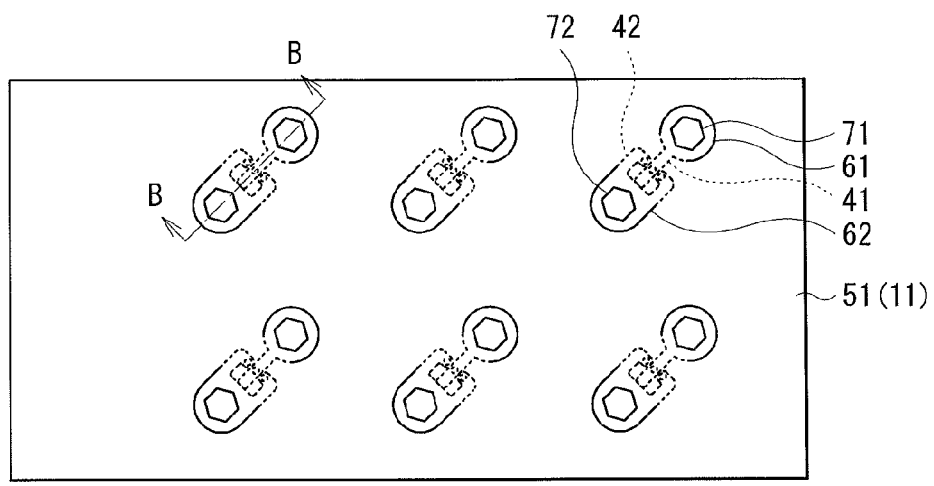
FIGS. 11A and 11B are diagrams illustrating a process following the process of FIGS. 10A and 10B.
Figure 11B:
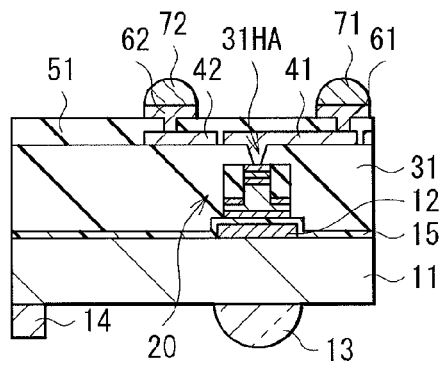

After the p-side wiring 41 and the n-side wiring 42 are formed, the passivation layer 51 is formed by, for example, providing polyimide on the p-side wiring 41 and the n-side wiring 42 as illustrated in FIGS. 9A and 9B. In the passivation layer 51, the openings are formed at the respective starting points of the p-side wiring 41 and the n-side wiring 42. Next, the UBM layers 61 and 62 are formed by, for instance, electroless plating, at the openings of the passivation layer 51 (FIGS. 10A and 10B). Subsequently, the solder bumps 71 and 72 are formed by, for example, plating (FIGS. 11A and 11B). Lastly, the substrate 11 is cut along a scrub line (not illustrated) provided in a central part of the protection wall 14, and accordingly the photoelectric converter 1 is completed.

In this photoelectric converter 1, a voltage is applied between the p-side electrode 26 and the n-side electrode 23 through signal transmission via the solder bumps 71 and 72 from the control semiconductor chip, and a driving current for laser oscillation flows from the p-side electrode 26 to the n-side electrode 23. At this moment, the current flowing through the upper DBR layer 25 has positive holes, and arrives at the active layer 24 after being confined by the oxidation confinement section 25A. The positive holes injected into this active layer 24 are recombined with electrons injected from the n-side electrode 23 side and thereby light is emitted. The light is reciprocated between the lower DBR layer 22 and the upper DBR layer 25, and thereby amplified to cause laser oscillation. A laser beam generated thereby is collimated and extracted by the lens 13, after passing through the N—GaAs layer 21 and the substrate 11. Here, the p-side wiring 41 has the excess wiring section 41B and therefore, deterioration of the mesa section 20M is suppressed. This will be described below in detail, by using a comparative example.

Figure 12A:
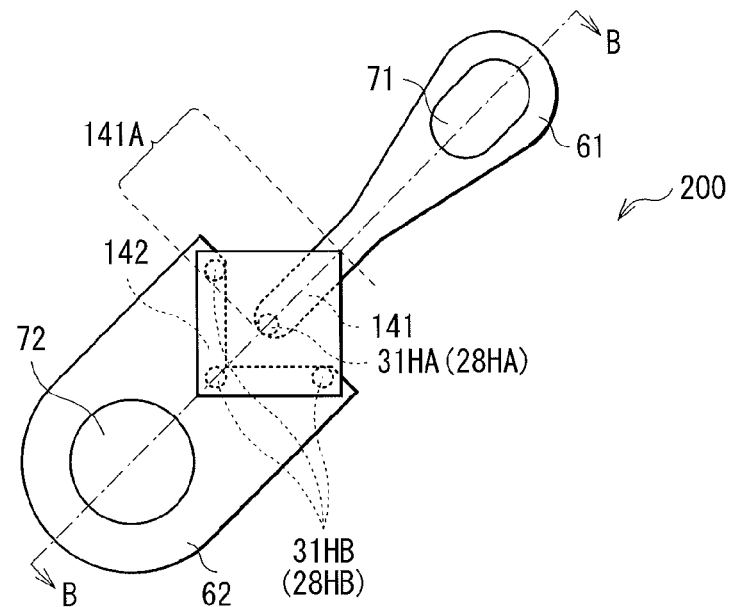
FIGS. 12A and 12B are diagrams each illustrating a configuration of a semiconductor laser device according to a comparative example.
Figure 12B:
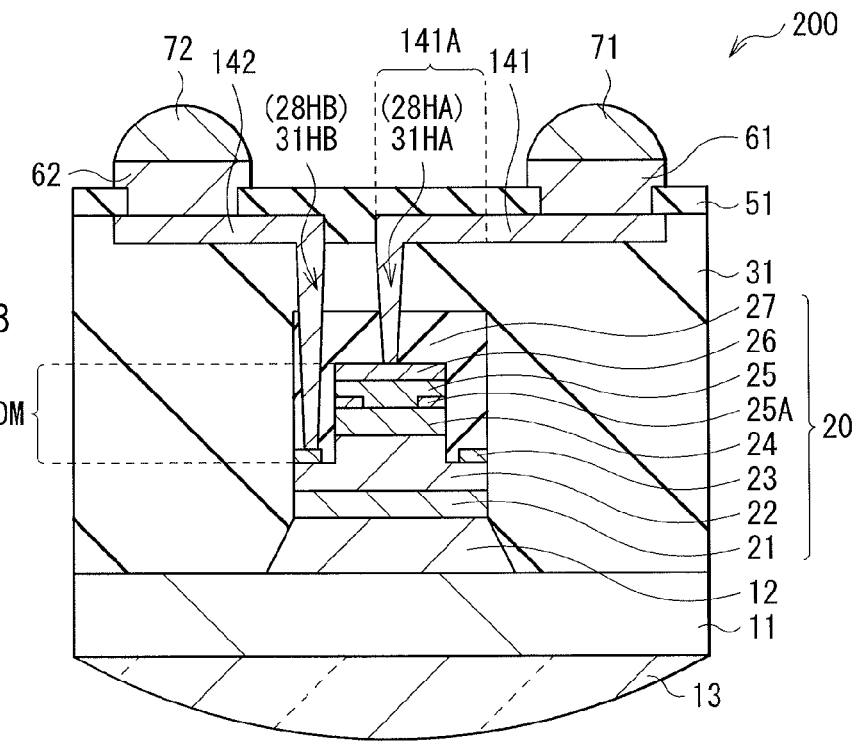

FIGS. 12A and 12B each illustrate a configuration of a semiconductor laser device (a semiconductor laser device 200) according to a comparative example. FIG. 12A is a top view of the semiconductor laser device 200, and FIG. 12B is a cross-sectional diagram taken along a line B-B depicted in FIG. 12A. A p-side wiring 141 of this semiconductor laser device 200 is provided only from a solder bump 71 to a connection aperture 31HA, and does not have an excess wiring region in a counter region 141A directly above a laminated body 20. A connection aperture 31HB is provided in an extension direction of the p-side wiring 141. The connection aperture 31HB (28HB) is provided at each of three corners of a mesa section 20M, which are not arranged to have point symmetry. This semiconductor laser device 200 has an emission lifetime shorter than that of a semiconductor laser device without having layers such as insulating layers 27 and 31, i.e. a semiconductor laser device with no embedment. The reason for this was clarified by the inventors as follows.

In the semiconductor laser device 200 that produces heat by driving or has a high temperature due to a rise in the ambient temperature, thermal expansion of the insulating layers 27 and 31 occurs. A resin, which is a material of the insulating layers 27 and 31, has a higher coefficient of thermal expansion than that of a metal (such as copper and gold) which is a material of the p-side wiring 141, by about an order of magnitude. Because of this difference in coefficient of thermal expansion, stress is exerted on the mesa section 20M in the extending direction of the p-side wiring 141 (i.e. a direction of the solder bump 71). In other words, the mesa section 20M is biased in the direction of the solder bump 71 (i.e. in a direction toward the right on FIG. 12B). This stress causes moment of a force in a direction biased toward a light emission region (an active layer 24) of the mesa section 20M. Therefore, the active layer 24 deteriorates, thereby reducing the life. In particular, an oxidation confinement section 25A slightly changes in its volume due to oxidation, thereby generating minute internal stress and thus, its strength is likely to be reduced. In the semiconductor laser device in a current confinement structure having such a weak oxidation confinement section 25A, the life tends to become short.

In the semiconductor laser device 2 of the present embodiment, in contrast, the p-side wiring 41 extends from the connection aperture 31HA in the direction opposite to the solder bump 71, and the counter region 41A is provided with the excess wiring region 41B. In other words, the p-side wiring 41 is provided to be laid across both sides of the connection aperture 31HA, and the counter region 41A is closer to a symmetry form. Therefore, stress exerted on the mesa section 20M is offset on both sides (in a lateral direction of FIG. 1B), and generation of moment of a force in a direction biased toward the active layer 24 is suppressed.

In the present embodiment, as described above, the excess wiring region 41B is provided in the counter region 41A of the p-side wiring 41 and thus, exertion of the stress in the biased direction on the mesa section 20M is allowed to be suppressed. Therefore, the emission lifetime is allowed to be improved, by preventing the active layer 24 from deteriorating due to thermal expansion of the insulating layer 27.

In addition, the connection aperture 31HA is provided at the center of the laminated body 20 (the mesa section 20M), and the counter region 41A has a point symmetric shape. Thus, stress exerted on each of the both sides become even, which allows a further improvement in the emission lifetime. Moreover, the two connection apertures 31HB (the counter regions 42A) of the n-side wiring 42 are provided to be symmetric about the mesa section 20M, and thereby the stress in the biased direction is allowed to be further reduced.

Modification

FIGS. 13A and 13B each illustrate a configuration of a semiconductor laser device (a semiconductor laser device 2A) according to a modification of the embodiment. FIG. 13A illustrates a plane configuration of the semiconductor laser device 2A, and FIG. 13B illustrates a cross-sectional configuration taken along a line B-B depicted in FIG. 13A. This semiconductor laser device 2A is different from the semiconductor laser device 2 of the embodiment, in that an excess wiring section 42B is provided also in the n-side wiring 42. Otherwise, the semiconductor laser device 2A has a configuration, a function, and effects similar to those of the semiconductor laser device 2. The same elements as those of the embodiment will be provided with the same characters as those of the embodiment, and the description thereof will be omitted.

The excess wiring section 42B is a part extending from the connection aperture 31HB in the direction opposite to the solder bump 72. In other words, the n-side wiring 42 of the semiconductor laser device 2A is provided to extend from the solder bump 72 beyond the connection aperture 31HB, to sit across both sides of the connection aperture 31HB. This excess wiring section 42B is provided for each of the two connection apertures 31HB. The excess wiring section 42B is provided in proximity to the laminated body 20, in addition to the counter region 42A, and has, for example, a length equal to or longer than the radius of the mesa section 20M. Since the excess wiring section 42B is thus provided in proximity to the counter region 42A, the stress exerted on the mesa section 20M not only from directly above but also from around is suppressed, and thereby the emission lifetime is allowed to be further improved.

Application Example

The photoelectric converter described with reference to the embodiment and the like is incorporated in, for example, an optical information processing unit (the optical information processing unit 3) illustrated in FIG. 14.

The optical information processing unit 3 is configured to include an optical waveguide 320, a light-emission photoelectric converter 330, and a light-receiving photoelectric converter 340. The optical waveguide 320 is implemented on a printed circuit board 310. For example, the photoelectric converter according to the embodiment of the technology may be used as the light-emission photoelectric converter 330.

The light-emission photoelectric converter 330 and the light-receiving photoelectric converter 340 are implemented on an interposer 350 by soldering. The light-emission photoelectric converter 330 and the light-receiving photoelectric converter 340 are electrically connected to ICs 371 and 372 via through electrodes 361 and 362 of this interposer 350. In this optical information processing unit 3, a laser beam is subjected to signal modulation by a semiconductor laser device of the light-emission photoelectric converter 330, and this laser beam is then received by a photodiode of the light-receiving photoelectric converter 340 through the optical waveguide 320. Such an optical-transmission and communication system is applicable to various kinds of locations such as those between electronic units, between boards in an electronic unit, and between semiconductor chips in a board.

The technology has been described with reference to the embodiment and the modification, but is not limited thereto and may be variously modified. For example, in the embodiment, the semiconductor laser device having the base 12 and the lens 13 on the substrate 11 has been described, but a substrate without the base and the lens may be used.

Further, in the embodiment and the modification, the laminated body 20 in a square pillar has been taken as an example, but the laminated body 20 may be in other shape. For example, the mesa section 20M shaped like a circular deep groove may be provided.

Furthermore, in the embodiment and the modification, the example in which the oxidation confinement section 25A is provided in a part of the upper DBR layer 25 has been described. However, the oxidation confinement section may be provided in other location, or may be omitted.

In addition, for example, the material and thickness of each layer, or the film formation methods and film formation conditions described in the embodiment are not limited. Alternatively, other materials and thicknesses, or other film formation methods and film formation conditions may be adopted.

Further, for example, the configuration of the semiconductor laser device has been specifically described in the embodiment, but it is not necessary to provide all the layers, or other layer may be further provided. Moreover, the arrangement of each layer (section) is not limited to those of the embodiment and the modification. For example, although the one connection aperture 31HA and the two connection apertures 31HB are provided in the embodiment, any number of connection apertures may be provided as long as the effects of the technology are achievable.

Still furthermore, the technology is also applicable to a semiconductor laser device, other than the AlGaAs-based semiconductor laser device.

Moreover, in the embodiment, the photoelectric converter 1 with the semiconductor laser device 2, namely, the light emitting unit, has been described as an example. However, the technology may be applied to, for example, a photoreceiver with a photodiode and the like.

Note that the technology may be configured as follows.

(1) A semiconductor laser device including:
a mesa section including an active layer, and having a first electrode on a top surface;
an embedding section covering the mesa section, and having a first connection aperture that reaches the first electrode; and
a first wiring provided on the embedding section to be laid across the first connection aperture, the first wiring being electrically connected to the first electrode through the first connection aperture.

(2) The semiconductor laser device according to (1), wherein
the mesa section is columnar, and
the first wiring extends on both sides of the first connection aperture, and has a length equal to or longer than a radius of the mesa section.

(3) The semiconductor laser device according to (1) or (2), wherein the embedding section has a first insulating layer and a second insulating layer, the mesa section forms a pillar laminated body by being covered with the first insulating layer, and
the second insulating layer covers the laminated body.

(4) The semiconductor laser device according to (3), wherein, of the first wiring, a region on the laminated body has a substantially point symmetry shape, with respect to a point at a center of the mesa section, and, of this region, a part extending from the first connection aperture to one side is an excess wiring section.

(5) The semiconductor laser device according to (3) or (4), further including:
a second electrode provided in the laminated body, and paired with the first electrode;
a second connection aperture provided in the embedding section, and reaching the second electrode; and
a second wiring provided on the embedding section, and electrically connected to the second electrode through the second connection aperture,
wherein, of the second wiring, a region on the laminate body has a substantially point symmetry shape, with respect to a point at a center of the mesa section.

(6) The semiconductor laser device according to (5), wherein the second wiring is provided to be laid across the second connection aperture.

(7) The semiconductor laser device according to any one of (1) to (6), wherein the mesa section is provided above one surface of a transparent substrate, and a lens corresponding to the active layer is provided on other surface of the transparent substrate.

(8) The semiconductor laser device according to (7), wherein a base is provided on the one surface of the transparent substrate, and the mesa section is disposed on the base.

(9) The semiconductor laser device according to any one of (1) to (8), wherein the mesa section includes a first multilayer reflective film, the active layer, a second multilayer reflective film, and a first electrode in this order, the second multilayer reflective film having an oxidation confinement section.

(10) The semiconductor laser device according to any one of (1) to (9), wherein a signal is inputted into the first wiring, only from one side of the first connection aperture in an extending direction of the first wiring.

(11) A photoelectric converter including a semiconductor laser device, the semiconductor laser device including:
a mesa section including an active layer, and having a first electrode on a top surface;

an embedding section covering the mesa section, and having a first connection aperture that reaches the first electrode; and a first wiring provided on the embedding section to be laid across the first connection aperture, the first wiring being electrically connected to the first electrode through the first connection aperture.

(12) An optical information processing unit including a semiconductor laser device and a photodetector of receiving light emitted from the semiconductor laser device, the semiconductor laser device including:

a mesa section including an active layer, and having a first electrode on a top surface;

an embedding section covering the mesa section, and having a first connection aperture that reaches the first electrode; and a first wiring provided on the embedding section to be laid across the first connection aperture, the first wiring being electrically connected to the first electrode through the first connection aperture.

The disclosure contains subject matter related to that disclosed in Japanese Priority Patent Application JP 2011-224950 filed in the Japan Patent Office on Oct. 12, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:
a mesa structure including an active layer;
a first electrode disposed on a top surface of the mesa structure;
an embedding member covering the first electrode and at least a portion of a side surface of the mesa structure, the embedding member having a first connection aperture that reaches the first electrode;
a first wiring disposed on the embedding member, the first wiring (i) having a length equal to or longer than a radius of the mesa section, (ii) overlaying the first connection aperture in its entirety, (iii) extending across opposite sides of the first connection aperture, and (iv) being electrically connected to the first electrode through the first connection aperture;
a second electrode disposed on a bottom surface of the mesa structure; and
a second wiring disposed on the embedding member, and electrically connected to the second electrode through a second connection aperture formed in the embedding member, wherein,
the embedding member includes a first insulating layer and a second insulating layer,
the mesa structure includes a pillar laminated body covered with the first insulating layer, and
the second insulating layer covers the laminated body.

2. The semiconductor light emitting device according to claim 1, wherein:
the mesa section is columnar.

3. The semiconductor light emitting device according to claim 1, wherein, of the first wiring, a region on the laminated body has a substantially point symmetry shape, with respect to a point at a center of the mesa structure, and, of this region, a part extending from the first connection aperture to one side is an excess wiring section.

4. The semiconductor light emitting device according to claim 1, wherein the second wiring overlays the second connection aperture.

5. The semiconductor light emitting device according to claim 1, wherein:
the mesa section is disposed above a surface of a transparent substrate, and
a lens corresponding to the active layer is on other surface of the transparent substrate.

6. The semiconductor light emitting device according to claim 5, wherein:
a base is on the one surface of the transparent substrate, and
the mesa structure is disposed on the base.

7. The semiconductor light emitting device according to claim 1, wherein:
the mesa structure includes a first multilayer reflective film and a second multilayer reflective film so as to sandwich the active layer; and
the second multilayer reflective film has an oxidation confinement section.

8. The semiconductor light emitting device according to claim 1, wherein a signal is configured to be input into the first wiring, only from one side of the first connection aperture in an extending direction of the first wiring.

9. A photoelectric converter comprising the semiconductor light emitting device according to claim 1.

10. An optical information processing device comprising:
the semiconductor light emitting device according to claim 1, and
a photodetector device configured to receive light signal.

* * * * *